United States Patent
Kanamori et al.

(10) Patent No.: US 6,917,547 B2
(45) Date of Patent: Jul. 12, 2005

(54) NON-VOLATILE SEMICONDUCTOR MEMORY DEVICE

(75) Inventors: Motoki Kanamori, Tachikawa (JP); Kunihiro Katayama, Chigasaki (JP); Atsushi Shiraishi, Kodaira (JP); Shigeo Kurakata, Kawagoe (JP); Atsushi Shikata, Higashimurayama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/616,955

(22) Filed: Jul. 11, 2003

(65) Prior Publication Data

US 2004/0008554 A1 Jan. 15, 2004

Related U.S. Application Data

(63) Continuation of application No. 10/078,471, filed on Feb. 21, 2002, now Pat. No. 6,608,784.

(30) Foreign Application Priority Data

Sep. 6, 2001 (JP) .................................... 2001-270013

(51) Int. Cl.[7] ................................................ G11C 7/00
(52) U.S. Cl. ........................................ 365/200; 365/201
(58) Field of Search ................................. 365/200, 201

(56) References Cited

U.S. PATENT DOCUMENTS

| | | | | |
|---|---|---|---|---|
| 5,532,962 A | * | 7/1996 | Auclair et al. | 365/201 |
| 5,778,418 A | * | 7/1998 | Auclair et al. | 711/101 |
| 5,907,856 A | | 5/1999 | Estakhri et al. | 711/103 |
| 6,046,935 A | * | 4/2000 | Takeuchi et al. | 365/185.03 |
| 6,134,143 A | | 10/2000 | Norman | 365/185.09 |
| 6,349,056 B1 | * | 2/2002 | Conley et al. | 365/185.04 |

FOREIGN PATENT DOCUMENTS

| | | |
|---|---|---|
| JP | 6-131886 | 5/1994 |
| JP | A-8-279295 | 10/1996 |

* cited by examiner

*Primary Examiner*—Vu A. Le
(74) *Attorney, Agent, or Firm*—Miles & Stockbridge P.C.

(57) ABSTRACT

When a non-volatile memory write error occurs in a card storage device containing a non-volatile memory and an error correction circuit, write data is read from the non-volatile memory and a check is made if the error can be corrected by the error correction circuit. If the error can be corrected, the write operation is ended. If the error correction circuit cannot correct the error, substitute processing is performed to write data into some other area.

7 Claims, 8 Drawing Sheets

NON-VOLATILE SEMICONDUCTOR MEMORY DEVICE

CROSS-REFERENCE TO RELATED APPLICATION

This application is a continuation of Application No. 10/078,471 filed Feb. 21, 2002 now U.S. Pat. No. 6,608,784.

BACKGROUND OF THE INVENTION

The present invention relates to a technology that may be applied to a non-volatile storage device, for example, to a technology that may be applied to a non-volatile semiconductor memory such as a flash memory or a card storage device such as a multimedia card or a smart media memory card.

Recently, a card storage device, called a memory card containing a non-volatile memory, such as a flash memory, that retains its storage data even after the power has been switched off, is widely used as a data storage medium for portable electronic apparatus such as a digital camera.

As compared with a volatile memory such as a RAM, a non-volatile memory varies widely in its memory device characteristics. At the same time, a non-volatile memory is not designed basically for repeated write operation. Therefore, write errors occur relatively frequently in a memory card in which a non-volatile memory is contained. To solve the above problem, some memory cards containing non-volatile memories execute substitute processing to substitute another area for an area where an error has occurred.

A flash memory, with a two-layer gate structure, stores data by taking advantage of a difference between the threshold voltage levels of the charge stored in the floating gate layer. In this specification, injecting electrons into the floating gate layer to increase the threshold voltage is called a write, and the reverse operation is called an erasure.

Conventionally, even if the write operation is executed under the same condition, a condition (hereinafter called an excessive write error) sometimes occurs in which increasing the write voltage of a storage device in a flash memory sometimes changes the threshold voltage of a particular bit so greatly that the threshold gets out of a desired range. To reduce such excessive write errors, the write voltage should be decreased. However, the problem is that a low write voltage prolongs the time required for writing. So, in general, with priority placed on a shorter write time rather than on a reduction in excessive write errors, the substitute processing described above is performed to recover excessive write error bits. In addition, some conventional memory cards contain an error correction circuit to correct detected error bits before outputting them.

However, excessive write errors occur more frequently as writing and erasure are repeated many times. Thus, a memory card designed to recover excessive write error bits through substitute processing described above, if used for a long time, must perform substitute processing more frequently. This prolongs the total time required for writing and, at the same time, decreases rewrite durability rapidly.

Conventionally, even a memory card containing an error correction circuit is designed to perform substitute processing for a write error even when the error correction circuit is able to correct the error. Therefore, an error correction circuit, if contained in a memory card, cannot prevent a long write time or a rapid decrease in write durability. Investigation made after the application of the present invention reveals that similar inventions, such as JP-A-6-131886 laid-open on May 13, 1994, have been made earlier.

SUMMARY OF THE INVENTION

It is an object of the present invention to provide a technology that reduces the write time required by a card storage device containing a non-volatile memory and an error correction circuit.

It is another object of the present invention to provide a technology, for use on a card storage device containing a non-volatile memory and an error correction circuit, that prevents the number of substitute processing executions from increasing with time and to prevent the write durability from decreasing rapidly.

The above-described objects and other objects, as well as the new features, of the present invention will be made more apparent by the detailed description and the accompanying drawings.

According to an aspect of the present invention, when a non-volatile-memory write error occurs in a card storage device containing a non-volatile memory and an error correction circuit, write data is read from the non-volatile memory and a check is made if the error can be corrected by the error correction circuit. If the error can be corrected, the write operation is ended. If the error correction circuit cannot correct the error, substitute processing is performed to write data into some other area.

According to the above aspect, substitute processing is performed to write data in some other area only when the error correction circuit cannot correct an error. Therefore, as compared with a method that always performs substitute processing when an error occurs, this method greatly reduces the number of substitution processing executions and, as a result, greatly reduces the data write time.

According to another aspect of the present invention, when a write error occurs, the storage device checks if the error is a recoverable error such as an excessive write error which causes the threshold voltage to change greatly even under the same write operation condition. The storage device checks if the error correction circuit can correct the error only when the error is a recoverable error and, only when the error is unrecoverable, performs substitute processing immediately. This reduces the number of times the error correction circuit must check if it can correct the error and reduces the total write time.

According to another aspect of the present invention, either when a write error that can be corrected by the error correction circuit occurs and when the number of error bits is larger than a predetermined number of bits, n, but smaller than a predetermined number of bits, m (where m> n), or, for write data smaller than one sector that is one unit of data written at a time, when no-write data in the same sector that is read contains an error and when the error correction circuit has judged that it can correct the error, the corrected data is written in the original location. This returns a bit, whose data has been changed by the so-called a retention defect, to a normal state. The retention defect refers to a change in the threshold voltage caused when a bit is not rewritten for a long time.

DETAILED DESCRIPTION OF THE EMBODIMENTS

Some preferred embodiments of the present invention will be described below with reference to the drawings.

Figure 1:
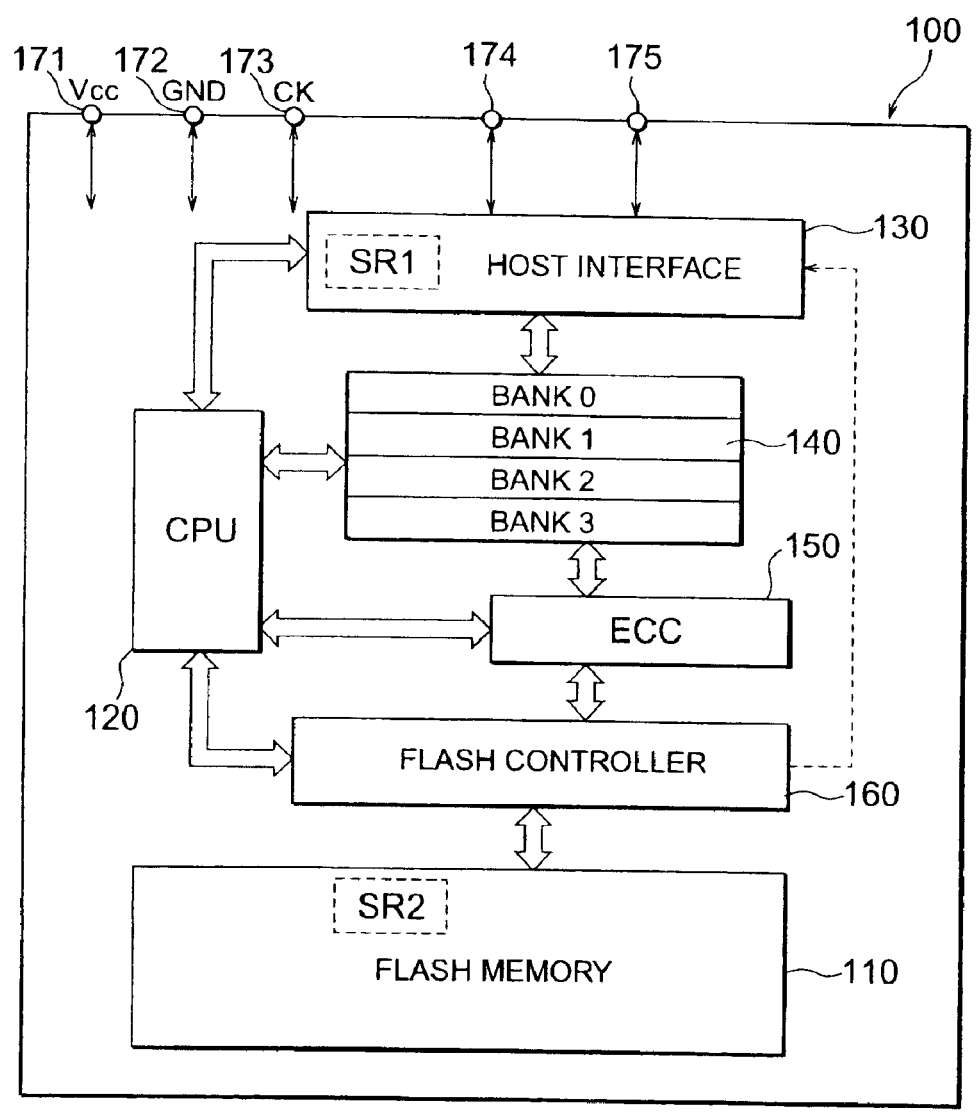
FIG. 1 is a block diagram showing an embodiment of a memory card containing a non-volatile memory to which the present invention is applied.

FIG. 1 shows an embodiment of a memory card containing a non-volatile memory according to the present invention.

Although not limited to this configuration, a memory card 100 in this embodiment comprises a flash memory (FLASH) 110 from which a predetermined amount of data may be electrically erased at a time, a microprocessor (CPU) 120 that controls the whole internal operations of the card, such as data transfer, based on externally supplied commands, an interface circuit 130 that transfers signals to and from external devices, a buffer memory 140, including a RAM and so on, that stores write data sent from external devices and read data sent from the flash memory 110, an error-correction-code generation & error correction circuit 150 that generates an error correction code for write data and that checks and corrects read data based on the error correction code, and a flash controller 160 that controls writing data to and reading data from the flash memory 110 in response to an instruction from the CPU 120.

The components of the memory card, such as the memory 110, CPU 120, and flash controller 160, each includes a semiconductor integrated circuit. Those semiconductor integrated circuits, which are mounted on a printed circuit board, are molded with resin to form the memory card 100.

Also provided on the memory card 100 in this embodiment are external terminals 171–175 that are electrically connected to the circuit of an external electronic device when the memory card is inserted into the card slot of the external electronic device. The external terminals 171 and 172 are the power terminal and the ground terminal that are connected to the power potential Vcc and the ground potential GND, respectively. The external terminal 173 receives a clock signal CK used to time the operation. The external terminal 174 is a terminal through which a command or an address sent from an external host CPU to the card is input and through which the contents of the status register are output from the card to the host CPU. The external terminal 175 is a terminal through which write data sent from the external host CPU to the card is input and through which data read from the card is output to the host CPU.

Signals are input and output from the external terminals 174 and 175 via the interface circuit 130. The buffer memory 140 comprises a plurality of banks. The bank specification signal and the read/write indication signal are supplied from the microprocessor 120 to the buffer memory 140. The bank status indication signal is supplied from the buffer memory 140 to the microprocessor 120. Write data transferred from the external host CPU is stored sequentially in the specified bank in the buffer memory 140 and, via the error-correction-code generation & error correction circuit 150, supplied to the flash memory 110. The microprocessor 120 converts a logical address entered from the external terminal 174 to a physical address and supplies the converted address to the flash memory 110 via the flash controller 160.

The synchronization clock SC is supplied from the microprocessor 120 to the error-correction-code generation & error correction circuit 150, and the signal indicating whether or not an error has been successfully corrected is supplied from the error-correction-code generation & error correction circuit 150 to the microprocessor 120. The interface circuit 130 includes a status register SR1 that contains an indicator indicating the status of the card, for example, whether or not write data has been transferred from the buffer memory 140 to the flash memory 110.

The status of the card is set in the status register SR1 by a signal from the microprocessor 120. The status bits of the status register SR1 include, for example, an error bit indicating that a write error has occurred, a ready/busy bit indicating that the card may be accessed, and an overflow bit indicating that the buffer memory 140 is full. In this embodiment, the contents of the status register SR1 may be read by a register read command, sent from the external host CPU, via the external terminal 174 via which the command is input. The memory card may also be configured such that the status of the flash memory 110 is written directly into the status register SR1 by a signal sent from the flash controller 160.

The flash memory 110 comprises a memory array that is a matrix of non-volatile storage devices including insulated-gate field effect transistors each with a floating gate, a word decoder that decodes an externally supplied address signal and activates the corresponding word line in the memory array to set it to the selection level, a data latch connected to the bit lines within the memory array to hold read/write data, and a boosting circuit that generates a high voltage required for writing and erasure. The data latch should be large enough to store data of one sector, that is, data of all storage devices connected to one word line. In addition, the flash memory 110 contains a status register SR2 that indicates whether data has been written normally or an error has occurred.

The flash memory used in the memory card in this embodiment is built such that it performs operation based on commands and control signals. Commands that may be issued to the flash memory include a read command, a write command, and an erase command. Control signals that are sent to the flash memory 110 include a chip select signal CE, a write control signal WE indicating whether the operation is a read operation or a write operation, an output control signal OE that indicates a time at which data is output, a system clock SC, and a command enable signal CDE that indicates which input has been received, command or address. Those commands and control signals are given by the flash controller 160.

The flash controller 160 has a control register. The microprocessor 120 sets up this control register to cause the flash controller 160 to control the operations, such as a write, read, and erase, to be performed for the flash memory 110. Signals supplied from the microprocessor 120 to the flash controller 160 include a control signal indicating which operation, read or write, is to be performed, an address signal specifying the control register and so on, and a data signal indicating data to be stored in the control register.

The configuration of a memory card on which a flash memory is mounted is not limited to that shown in FIG. 1. The memory card may use a flash memory that contains the error-correction-code generation & error correction circuit or may use a chip that combines the error-correction-code generation & error correction circuit with the controller. In addition, the flash memory 110 may be either a binary flash memory in which one-bit data is stored in one storage device or a multi-valued flash memory in which multiple-bit data is stored in one storage device by controlling the threshold voltage.

Furthermore, rather than mounting only one flash memory, multiple flash memories may be mounted. In that case, ECC circuits may be provided, one for each chip, or one ECC circuit may be shared among multiple flash memories. Although the memory card in this embodiment has two controllers, that is, microprocessor 120 and flash controller 160, the memory card may have only one of them.

A first embodiment of write processing that is used when the present invention is applied to the memory card with the configuration described above will be described with reference to the flowchart in FIG. 2.

When writing data in the memory card in the first embodiment of write processing, a data transfer command is first sent from an external host CPU to the memory card (step S1). Then, write data is transferred from the host CPU to the memory card. The transferred command is supplied to the microprocessor 120 via the interface 130, and the transferred data is stored in the buffer memory 140 via the interface 130 (step S2). The command and the data described above are transferred serially. A write address is sent with the command.

After write data is transferred in a predetermined manner, the write data is then transferred from the buffer memory 140 to the flash memory 110 (step S3). The data is transferred in parallel, eight bits at a time. At this time, the write data is transferred via the error-correction-code generation & error correction circuit 150, with the result that an error correction code is added every 512 bytes before the data is supplied to the flash memory 110.

Next, the data is written in the flash memory 110, one sector at a time (step S4). When the write operation ends, the status register SR2 in the flash memory 110 indicates whether the write operation ended normally or an error occurred. The status register is checked for a write error (step S5). If no error is found, one write operation ends.

On the other hand, if a write error occurred, data is read from the sector of the flash memory 110 where the error occurred in the next step, S6. The data that was read is sent to the error-correction-code generation & error correction circuit 150 for error correction processing (step S7). The error-correction-code generation & error correction circuit 150 supplies a signal, which indicates whether or not the error has been successfully corrected, to the microprocessor 120 to allow it to judge whether the error can be corrected (step S8). If it is judged that the error can be corrected, one write operation ends. If it is judged that the error cannot be corrected, substitute processing is performed to write data into some other sector (step S9) and then the write operation ends.

This substitute processing is performed by writing the write data, stored in the data latch in the flash memory 110, directly into an alternate sector. This method eliminates the need for supplying write data again to the flash memory 110; only the write operation command and the alternate sector address need be supplied. It is also possible to supply the write data, stored in the buffer memory 140, to the flash memory 110 again when substitute processing is performed.

In this embodiment, even when a write error occurs, the write operation successfully ends if the error correction circuit can correct the error. Only when the error cannot be corrected, write data is written in some other sector. Therefore, as compared with a method in which substitute processing is always performed when a write error occurs, the method used in this embodiment significantly reduces the number of times substitute processing is performed and, therefore, significantly reduces the time required to write data into the flash memory.

Figure 3:
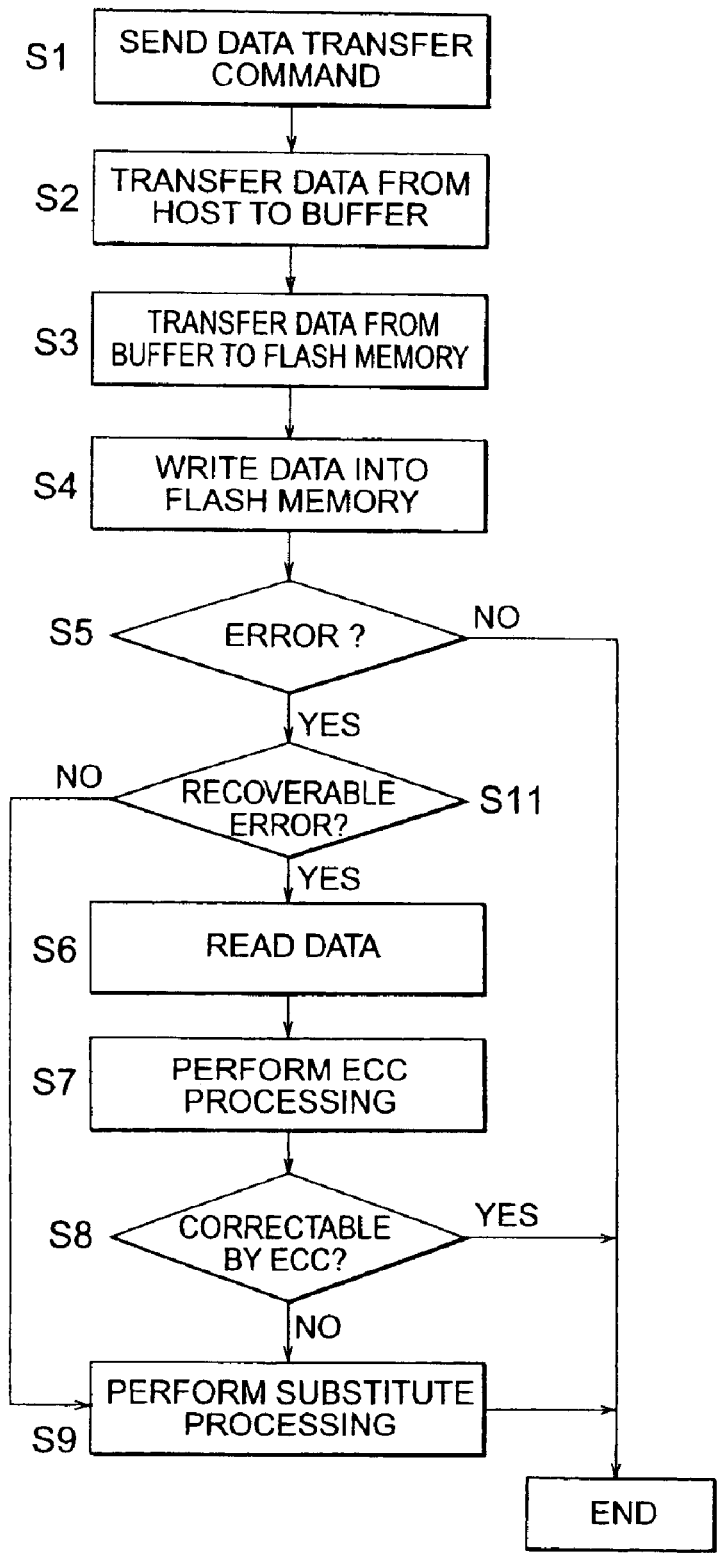
FIG. 3 is a flowchart showing a second embodiment of write processing for the memory card to which the present invention is applied.

Next, a second embodiment of write processing that is used when the present invention is applied to the memory card in FIG. 1 will be described with reference to the flowchart in FIG. 3. This embodiment may be used when the status register SR2 in the flash memory 110 has the following flags: a flag indicating that a general write error has occurred when there is a bit whose threshold voltage does not reach a predetermined level at write time and a flag indicating that a recoverable error, such as an excessive write error, has occurred when there is a bit whose threshold voltage exceeds a predetermined level at write time.

Figure 2:
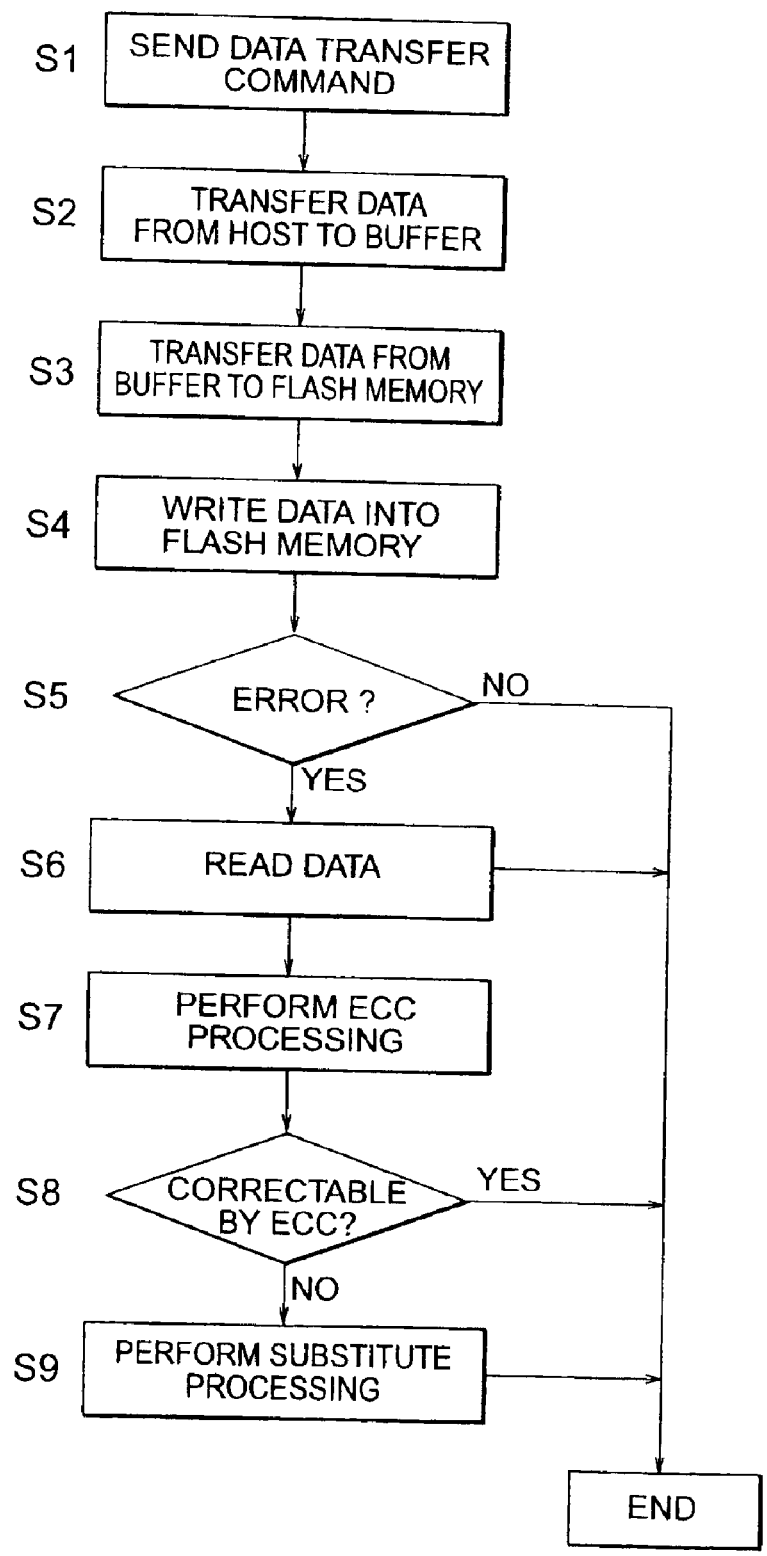
FIG. 2 is a flowchart showing a first embodiment of write processing when the present invention is applied to the memory card in FIG. 1.

Write processing in this embodiment is almost the same as that of the first embodiment in FIG. 2. The only difference is step S11 that follows step S5 in the flowchart in FIG. 2. In this step, the flag in status register SR2 are checked to determine whether to correct an error with the error correction circuit. In step S11, the excessive write error flag is checked to see if there is a bit whose threshold voltage exceeds a predetermined level at write time. In this embodiment, if the flag indicates that there is an excessive write error, a check is made in steps S6–S8 if the error correction circuit can correct the error and, only when the error correction circuit cannot correct the error, substitute processing is performed. On the other hand, if it is judged in step S11 that there is no excessive write error, control is passed directly to step S9 to perform substitute processing.

A bit where an excessive write error occurs is a bit that may be recovered to a normal bit, while a bit where the threshold voltage does not reach a predetermined level at write time is a defective bit that cannot be recovered. The write processing method in this embodiment immediately performs substitute processing for a sector where a write error is generated by an unrecoverable, defective bit and, then, bypasses steps S6–S8 to reduce the time required for writing data.

On the other hand, when the write error is an excessive write error generated by a recoverable bit where the threshold voltage exceeds a predetermined level, a check is made in steps S6–S8 if the error correction circuit can correct the error and, only when the error correction circuit cannot correct the error, substitute processing is performed. Therefore, as compared with the method in which substitute processing is always performed when a write error occurs, the method in this embodiment significantly reduces the number of times substitute processing is performed and significantly reduces the time required for writing data into the flash memory as in the first embodiment.

Next, a third embodiment of write processing that is used when the present invention is applied to the memory card in FIG. 1 will be described with reference to the flowchart in FIG. 4. This embodiment includes recovery processing for a so-called retention defect bit that is generated when the threshold voltage is out of a predetermined range because data has not been rewritten for a long time.

A part of write processing in this embodiment is the same as that of write processing in the first embodiment shown in FIG. 2. The only difference is retention defect recovery processing in steps S21–S23 that are inserted between steps S8 and S9 in the flowchart in FIG. 2.

More specifically, when the error correction circuit has judged that it can correct the error in step 8, a check is made in the next step, S21, if the number of errors is smaller than a predetermined number n (for example, 2). If so, the write operation is ended immediately. On the other hand, if the number of errors is larger than the predetermined number n, another check is made in step S22 if the number of errors is smaller than a second predetermined number m (for example, m=3 where m>n). If the number of errors is larger than the predetermined number, control is passed immediately to step S9 where substitute processing is performed. If the number of errors is smaller than m in step S22, refresh write processing is performed in the next step, S23, before control is passed to S9 where substitute processing is performed.

Refresh write processing refers to processing in which data is read from a particular sector, the data is corrected by the error correction circuit, and then the data is written back into the sector from which it was read. The storage devices in the sector are once erased before data is written back. By performing this processing, a bit where a read error was generated by a retention defect error is recovered and correct data may be written in the flash memory. The read data corrected by the error-correction-code generation & error correction circuit 150 is once stored in the buffer memory 140 and then transferred to the flash memory 110.

Although not limited to this error correction method, the error-correction-code generation & error correction circuit 150 in this embodiment performs error correction processing, 512 bytes (that is, one quarter of data in a sector) at a time. "n" in step S21 and "m" in step S22 are each the unit of 512-byte data for which error processing is to be performed. In steps S21 and S22, error checking is performed for each 512-byte data at a time.

In addition, the error correction circuit used in this embodiment preferably has a function for outputting the number of error-corrected bits. This embodiment may also be applied to an error correction circuit with no such function because the number of error-corrected bits may be found by inspecting how many times the one-bit error correction circuit is used.

Next, a modified embodiment of the third embodiment shown in FIG. 4 will be described with reference to the flowchart in FIG. 5. The embodiment in FIG. 4 is advantageously applied when all data in one sector is rewritten, while the modified embodiment in FIG. 5 is used to recover retention defect bits included in the no-rewrite data when data less than one sector in size is rewritten.

Figure 4:
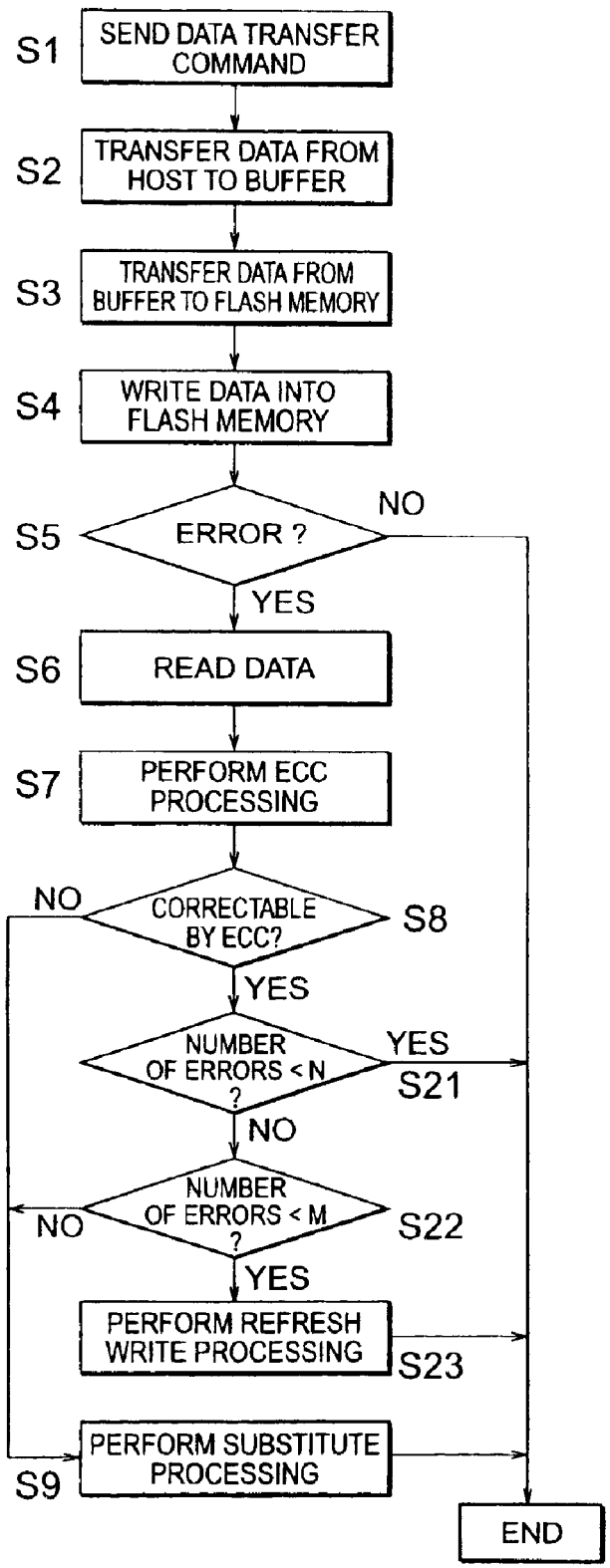
FIG. 4 is a flowchart showing a third embodiment of write processing for the memory card to which the present invention is applied.
Figure 5:
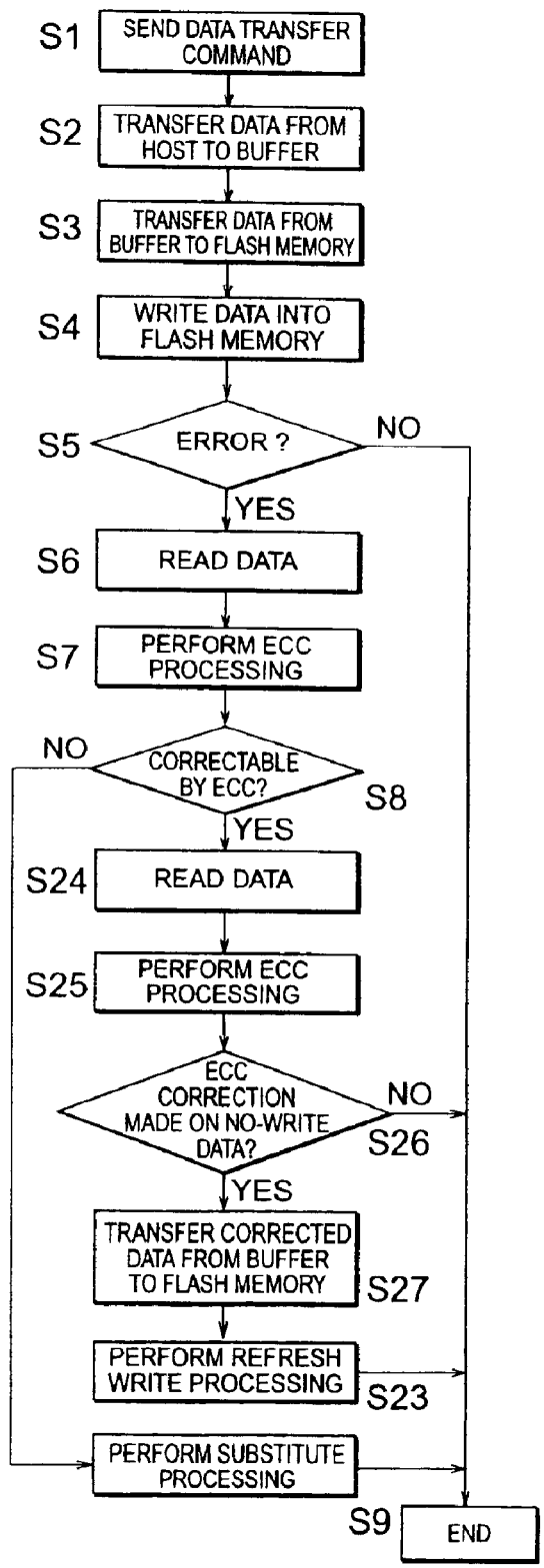
FIG. 5 is a flowchart showing a fourth embodiment of write processing for the memory card to which the present invention is applied.

In this embodiment, the following steps are used instead of steps S21 and S22 in the flowchart in FIG. 4; that is, steps 24 and 25 in which data is read from the same sector again and error correction is performed, step S26 in which a check is made for no-rewrite data in the sector if error checking was performed for it, step S27 in which corrected data stored in the buffer is transferred to the flash memory 110 when error correction was performed, and step S28 in which refresh write processing is executed with corrected data. If it is found that no error processing was performed for no-rewrite data in step S26, the write operation on the sector is ended immediately.

Figure 6:
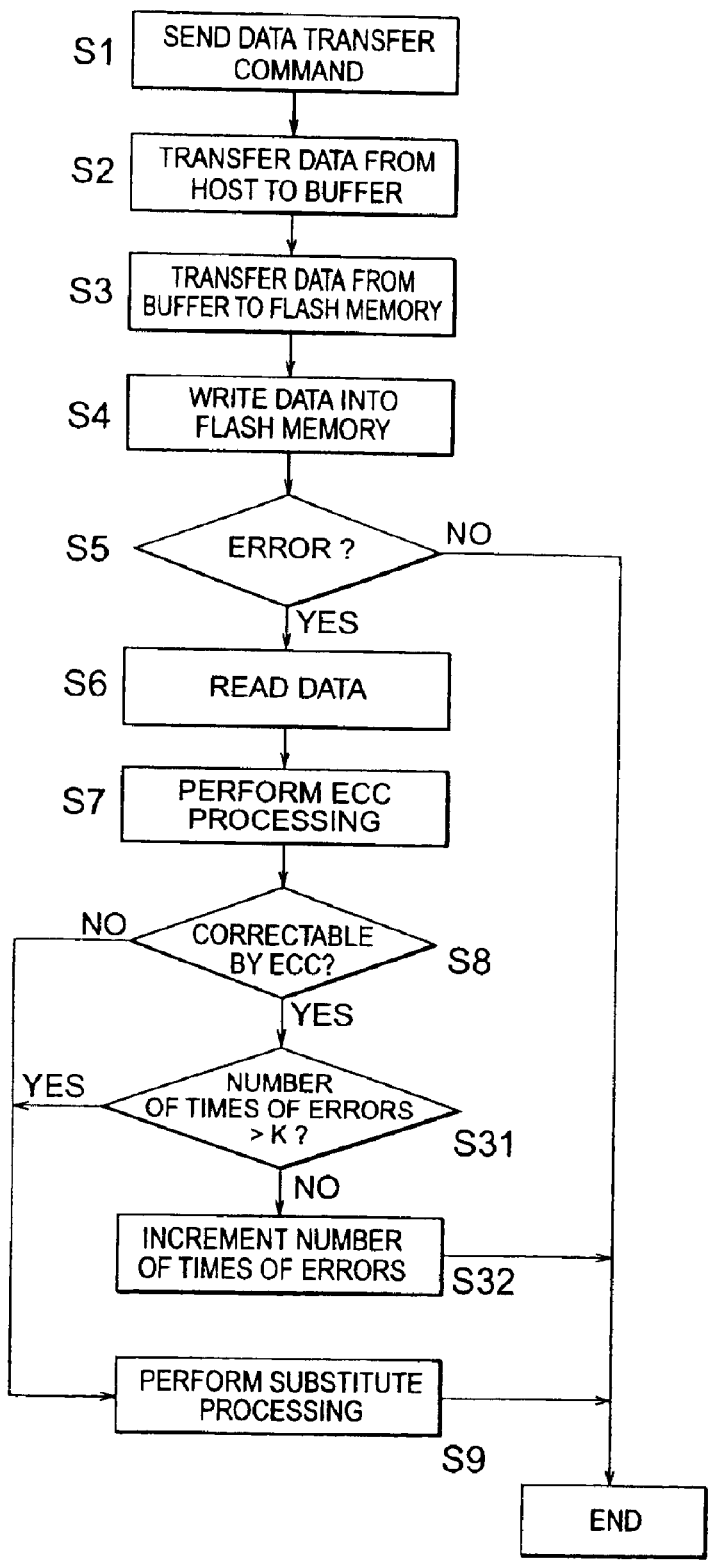
FIG. 6 is a flowchart showing a fifth embodiment of write processing for the memory card to which the present invention is applied.

Next, a fifth embodiment of write processing that is used when the present invention is applied to the memory card in FIG. 1 will be described with reference to the flowchart in FIG. 6. This embodiment is a revised embodiment of the first embodiment.

Steps S1 to S8 of the write processing in this embodiment are the same as those of the write processing in the first embodiment in FIG. 2. The only difference is that, if the error correction circuit judges in step S8 that an error can be corrected, a check is made in the next step, S31, in this embodiment if the number of times of error corrections is larger or smaller than a predetermined number k (for example, 10). If the number of times of error corrections is smaller than the predetermined number, the error counter is incremented in the next step, S32, and the write operation is ended immediately. On the other hand, if the number of times of error corrections is larger than the predetermined number k, control is passed to step S9 to perform substitute processing.

Although bits where an excessive write error occurred can be recovered in most cases, an excessive write error occurs frequently on some bits because of defective storage devices. This embodiment performs substitute processing when the number of error corrections exceeds the predetermined number k to substitute some other sector for a sector containing a bit where an excessive write error occurs frequently. This method reduces the number of write errors that are generated by such a bit, eliminates the need for the error correction circuit to check if the error can be corrected, and reduces the time required for writing.

In step S32, the number of error corrections that has been counted is stored in the management area of the sector in the flash memory 110 in this embodiment. However, the embodiment is not limited to this configuration. The number of error corrections may be stored in some other area in the flash memory, in the buffer memory 140, or in the CPU 120.

Figure 7:
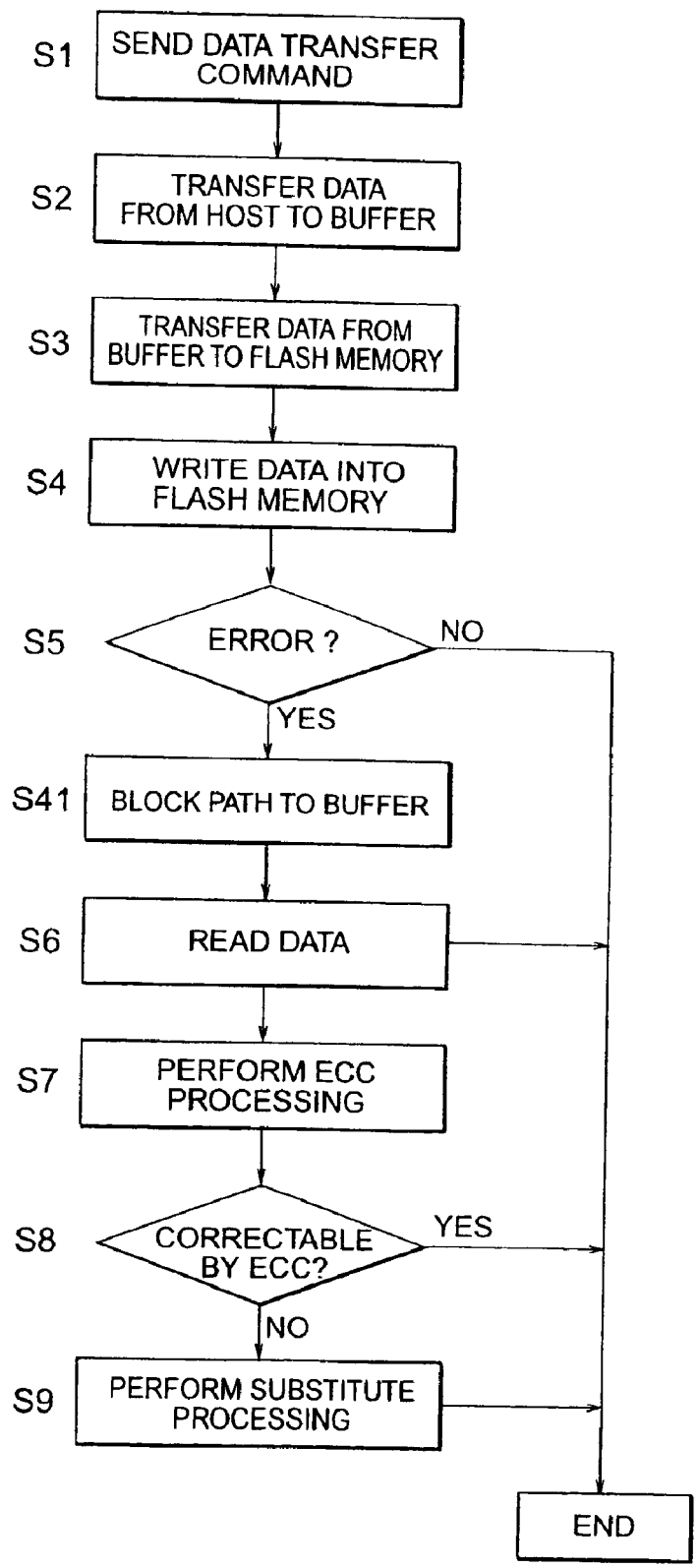
FIG. 7 is a flowchart showing a sixth embodiment of write processing for the memory card to which the present invention is applied.

Next, a sixth embodiment of write processing that is used when the present invention is applied to the memory card in FIG. 1 will be described with reference to the flowchart in FIG. 7 and the block diagram in FIG. 8.

The write processing in this embodiment is almost the same as that in the first embodiment in FIG. 2. The only difference is that step S41, in which a read-data-supply path to the buffer memory 140 is blocked, is inserted in this embodiment between step S5 in which a check is made for an error and step S6 in which data is read from the flash memory.

In this embodiment, a check is made in step S8 if the error correction circuit 150 can correct the error and, only when the circuit cannot correct the error, substitute processing is performed. This is because, unlike the embodiments in FIG. 4 and FIG. 5, the refresh write processing is not performed in this embodiment and therefore data, read from the flash memory, need not be stored in the buffer memory.

On the other hand, when a write error occurs, blocking the read-data-supply path to the buffer memory 140 as in this embodiment before reading data from the flash memory prevents the read data from occupying a part of the buffer memory 140. This allows the CPU 120 to use a free buffer memory to write data into the flash memory and to get the next write data concurrently, thus reducing the time required for writing.

Figure 8:
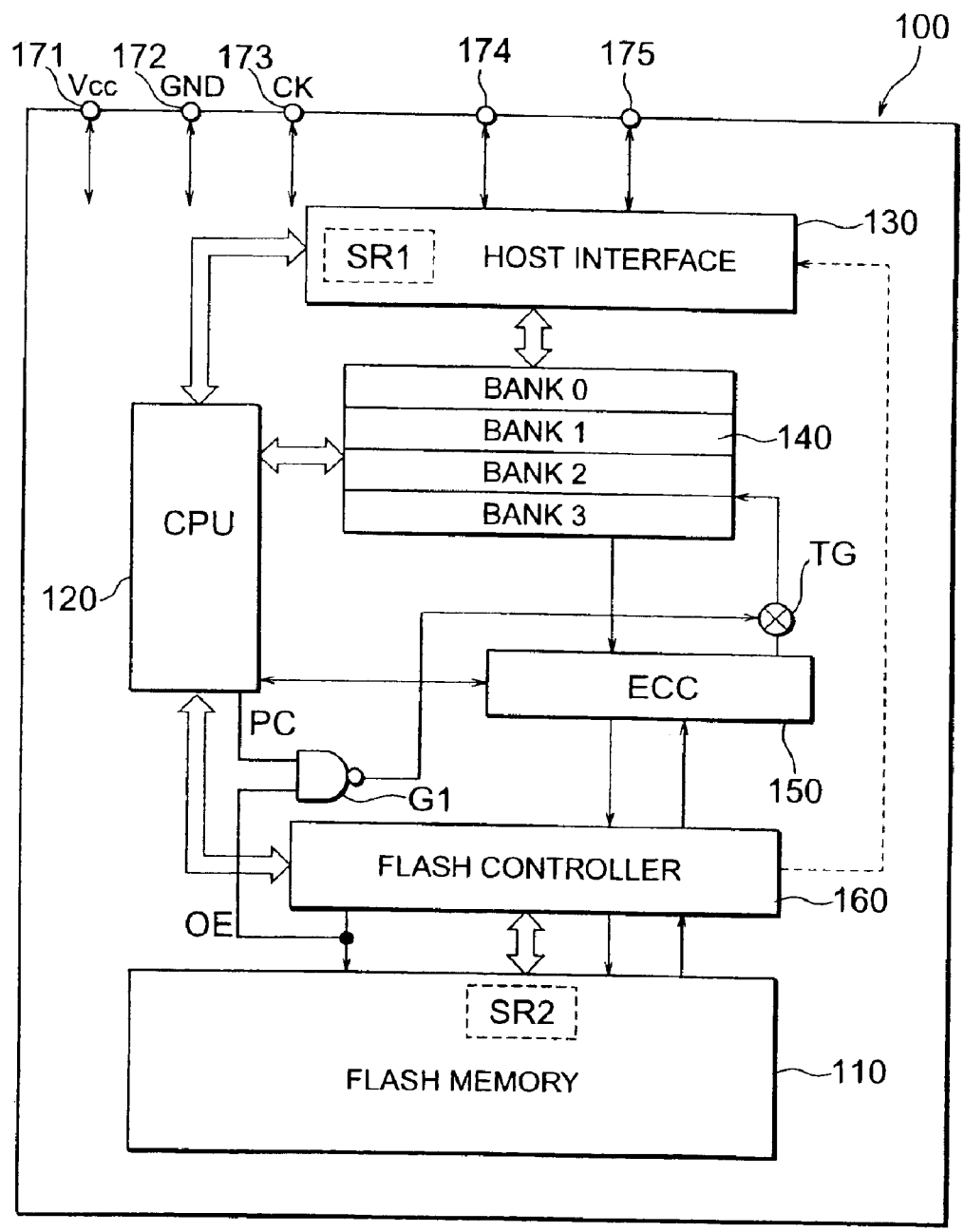
FIG. 8 is a block diagram showing an example of the configuration of a memory card to which the second embodiment of write processing of the present invention is applied.

When a transmission gate TG is provided on the read data path between the error correction circuit 150 and the buffer memory 140 as shown in FIG. 8, this embodiment may be configured as described below. That is, a logic circuit, such as a NAND gate G1, is provided to calculate the logical product, for example, between the output control signal OE output from the flash controller 160 to the flash memory 110 and the read path block signal PC output from the CPU 120. This configuration causes the output signal from this NAND gate G1 to block the transmission gate TG.

Although the present invention made by the inventor has been described in its preferred embodiments, it is to be understood that the present invention is not limited to the embodiments described above but may be changed in various ways without departing from the spirit of the present invention. For example, in the above embodiments, the error correction method used by the error-correction-code generation & error correction circuit 150 may be any method including the one using the Reed Solomon code, Hamming code, or BCH code. In addition, although a memory card containing a buffer memory has been described in the embodiment, the buffer memory is not always required except in the sixth embodiment. A memory card not containing a buffer memory may be used in other embodiments of the present invention.

In the above description, the invention made by the inventor is described primarily for a memory card containing a flash memory that is in the background field of the invention. However, the present invention is not limited to the memory card described above. The present invention may be applied also to EEPROM chips, other non-volatile memories, memory cards containing such memories, and a memory module including a board on which a plurality of non-volatile memory chips are mounted.

According to the described embodiments of the present invention, when a write error occurs in a card storage device containing a non-volatile memory and an error correction circuit but the error can be corrected by the error correction circuit, the storage device does not perform substitute processing in which data is written in some other address. This reduces the time required for writing and, at the same time, prevents rewrite durability from decreasing rapidly.

It should be further understood by those skilled in the art that the foregoing description has been made on embodiments of the invention and that various changes and modifications may be made in the invention without departing from the spirit of the invention and the scope of the appended claims.

What is claimed is:

1. A non-volatile memory comprising:

a plurality of nonvolatile memory cells; and an error correcting circuit, wherein a program command accompanied with address information and first data are received from outside, wherein, in a program operation executed in response to said program command, first nonvolatile memory cells of said plurality of nonvolatile memory cells are selected in accordance with said address information and programmed with said first data, wherein, after said first nonvolatile memory cells are programmed with said first data in said program operation, second nonvolatile memory cells of said plurality of nonvolatile memory cells are selected and second data stored therein are read out, wherein said error correcting circuit judges whether said second data includes one or more errors and corrects said second data to create third data when said second data includes one or more errors, and wherein said second nonvolatile memory cells are programmed with said third data after said second data is corrected by said error correcting circuit.

2. A nonvolatile memory according to claim 1, wherein, after said first data is programmed and before said second nonvolatile memory cells are selected:

said first nonvolatile memory cells are selected and fourth data stored therein is read out, said error correcting circuit judges whether said fourth data includes errors which are correctable or not correctable, said first nonvolatile memory cells are programmed again with said first data, if said fourth data includes errors which are not correctable by said error correcting circuit, and programming of said first nonvolatile memory cells with said first data is completed if said fourth data includes errors which are correctable by said error correcting circuit.

3. A nonvolatile memory according to claim 2, wherein after said first data is programmed:

said error correcting circuit judges whether said fourth data includes errors which are correctable or not correctable, and when said error correcting judges that said fourth data includes errors which are not correctable, third nonvolatile memory cells of said plurality of nonvolatile memory cells, different from said first nonvolatile memory cells, are selected and programmed with said first data.

4. A nonvolatile memory according to claim 3, further comprising a controller including said error correcting circuit.

5. A nonvolatile memory according to claim 4, wherein:

said controller further includes a buffer memory, and said first data is stored in said buffer memory until completion of programming with said first data.

6. A nonvolatile memory according to claim 1, wherein each of said plurality of nonvolatile memory cells is a one-bit memory cell.

7. A nonvolatile memory according to claim 1, wherein each of said plurality of nonvolatile memory cells is a multiple-bit memory cell.

* * * * *